United States Patent [19]

Daniele et al.

[11] Patent Number: 4,839,768

[45] Date of Patent: Jun. 13, 1989

[54] PROTECTION OF INTEGRATED CIRCUITS FROM ELECTROSTATIC DISCHARGES

[75] Inventors: Vincenzo Daniele, Brugherio; Mirella Benedetti, Vimercate, both of Italy

[73] Assignee: SGS Microelettronica S.p.A., Catania, Italy

[21] Appl. No.: 113,113

[22] Filed: Oct. 27, 1987

[30] Foreign Application Priority Data

Dec. 3, 1986 [IT] Italy ............................... 83666 A/86

[51] Int. Cl.$^4$ ............................................. H02N 3/20
[52] U.S. Cl. ........................................ 361/56; 361/91; 357/23.13
[58] Field of Search ................... 361/56, 86, 91, 111; 357/23.13

[56] References Cited

U.S. PATENT DOCUMENTS

| | | | |
|---|---|---|---|
| 4,736,271 | 4/1988 | Mack et al. | 361/91 |
| 4,739,438 | 4/1988 | Sato | 357/23.13 X |
| 4,745,450 | 5/1988 | Hartranft et al. | 361/91 |
| 4,777,518 | 10/1988 | Mihara et al. | 357/23.13 |

*Primary Examiner*—Derek S. Jennings
*Attorney, Agent, or Firm*—Wenderoth, Lind & Ponack

[57] ABSTRACT

The influence of the resistance of the connection between a terminal of voltage limiting diodes against discharges of electrostatic nature which may hit a pad of an integrated circuit and a respective common potential node of the integrated circuit (supply or ground node) is unsuspectably critical. A resistance of just few ohms may depress the maximum tolerable discharge voltage by several thousands volts and the relationship between such two parameters is hyperbolic. Such a critical resistance may advantageously be reduced by utilizing more levels of metallization purposely connected in parallel and/or by "shifting" the protection diodes near the real (and not virtual) common potential node of the circuit or by utilizing "ring" metallizations over different levels for both the common potential nodes of the circuit.

8 Claims, 2 Drawing Sheets

PROTECTION OF INTEGRATED CIRCUITS FROM ELECTROSTATIC DISCHARGES

BACKGROUND OF THE INVENTION

The present invention relates generally to semiconductor devices and more integrated circuits and, particularly, to technical expedients implemented for protecting the active and/or passive components of the integrated circuits from the possibility of being accidentally damaged by electrical discharges of an electrostatic origin during the fabrication, assembly and/or handling of the device or integrated circuit.

Great technological advances in the field of the fabrication techniques of integrated circuits have permitted a great increase in the density of the circuits and the performances of the single circuit components but, at the same time have often cause a greater sensitivity of some of these components to damages attributable to accidental electrical discharges of an electrostatic origin.

In this respect, it is known that floors, glasses, containers and carriers for handling wafers, plastic bags and plastic tubes for carrying the devices are highly dangerous materials because of the relatively high potentials which these materials may easily assume (up to 30 kV).

Moreover, the operator himself in handling devices may induce an electrical discharge of an appreciable value.

The use of particular antistatic materials for flooring, for bench tops and other expedients which ensure a continuous drainage of electrical charges by dispersing them toward ground are indispensable in order to prevent discharges of a high intensity.

However, even a most sophisticated antistatic system is insufficient in preventing accidental damages, especially in the case of particularly sensitive components which show failures with voltages on the order of 100–400 V. In these instances a circuital type of intervention becomes necessary; moreover, even intrinsically sturdy semiconductor structures, if handled in environments not particularly equipped so as to prevent triboelectric effects, may be subject to failure.

From the point of view of resistance to damage from electrostatic discharges, each particular type of device shows a proper interval of voltages beyond the limits of which the discharge, by a voltage effect in MOS devices or by a current effect in bipolar devices, causes failure or degradation.

With a high scale of integration and therefore with ever smaller geometries, the problem, originally limited to the domain of MOS devices, has presented itself also in the domain of bipolar integrated circuits and of course also in the so-called mixed processes which realize MOS and bipolar components on the same monolithic substrate (chip).

Electrostatic discharges involving base-emitter junctions in small area transistors may cause irreversible damage, and may cause irreversible puncturing of the thin layer of gate oxide in MOS components as well as in integrated capacitors.

In integrated circuits the problem is generally tackled by making protection structures essentially acting as a limiting diode between each input pad of the integrated circuit and, respectively the common ground (or $V_{SS}$) and the common supply node (or $V_{DD}$). Commonly such a protection structure is an appropriate junction connected between the input pad and the respective ground or supply node. In the case of an output pad, the junction may be that of the integrated output device itself or of the output stage of the circuit.

Such protection systems have been amply debated and analyzed in terms of their "efficiency" and sturdiness as well as in terms of the area requirement of the integrated protection structures and in terms of the speed of intervention, quantified in terms of the RC constant measured between the relative terminal and the ground ($V_{SS}$) or supply ($V_{DD}$) terminal.

In known analyses of the problem and of state-of-the-art technical proposals for ensuring immunity from damage of devices when subjected to electrostatic discharges of several thousands Volts, the attention has been almost exclusively directed to reducing as much as possible the intrinsic series resistance and the area requirement of the protection diode deployed to provide the necessary discharge path of the negative electric charge (i.e. toward ground or $V_{SS}$) or of the positive electric charge (i.e. toward the positive supply node or $V_{DD}$) which may accidentally become applied to the relative input or output pin (or pad) of the integrated circuit.

The location of the protection diode or diodes is almost exclusively adjacent to the pad itself, if not at least partially underneath the metallized area of the pad to which one terminal of the protection diode is connected in order to save useful chip area. The other terminal of the diode is connected to adjacent metal tracks (i.e. supply or $V_{DD}$) or ground (or $V_{SS}$).

On the other hand, with such typical layouts, remarkable differences among "holding" levels with respect to electrostatic discharges for different pins of the same integrated circuit are often observed, especially among different input pins of the circuit. These differences can not be accounted for in terms of the normal "spread" of parameters of distinct similar integrated devices and of distinct protection diodes.

Obviously it is the holding level of the pin experimentally found "weaker" which determines a positive or negative result of a quality control test conducted on a particular integrated circuit according to applicable standard specifications.

SUMMARY OF THE INVENTION

It is a main objective of the present invention to provide an improved method for protecting integrated circuits from electrical discharges of an electrostatic origin.

The present inventors have found an unsuspected great influence of the resistance of different tracks or path of the ground ($V_{SS}$) or supply ($V_{DD}$) metallization to which the protection diodes are connected. Such an influence, rather than having a secondary if not negligible effect, as it has been evidently prejudicially believed until now, has emerged to be by far the most critical factor for obtaining a desired high level of the holding voltage (i.e. high level of protection). Even more surprisingly is the "weight" that such a single factor assumes in reaching or not reaching protection threshold voltages of electrical discharges of an electrostatic origin which differ one from another by several thousands of Volts.

Essentially, in accordance with the present invention, the terminals of the protection diodes are not merely connectd to what may be defined as merely "virtual" supply or ground nodes of the circuit but must be connected to such common potential nodes of the circuit in

DESCRIPTION OF THE PREFERRED EMBODIMENTS

Figure 1:
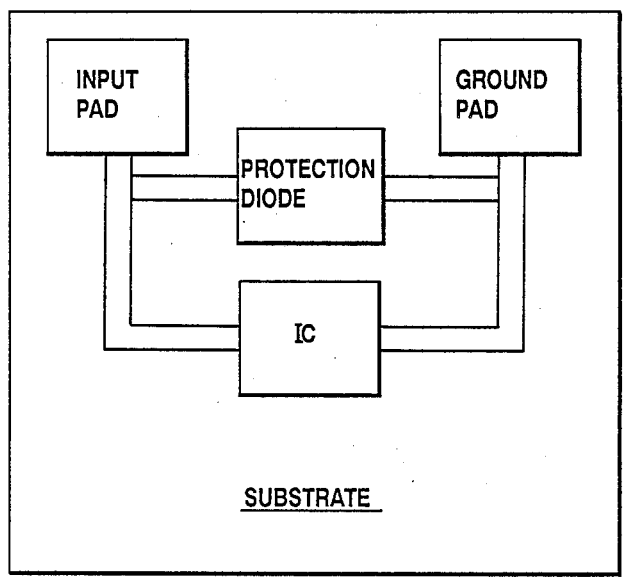
FIG. 1 illustrates a view of a substrate containing an integrated circuit and a protection diode.

It has been found by the present inventors that even a relatively small resistance of the particular "branch" of the ground or supply metal track to which the terminal of the protection diode is connected, of just few ohms, may depress by several thousands Volts the maximum tolerable level of an electrostatic discharge voltage which may be applied to the particular pin and beyond which an irreversible damage of integrated devices connected to the particular input pad of the circuit is observed.

It has always been an opinion of skilled technicians that a resistance of just few ohms, e.g. of 10 ohms, of a particular path of ground metallization which, branching out from the respective pad, reaches the neighborhood of a particular pad (e.g., an input pad of the circuit) and to which was connected the terminal of the protection diode, could not have but a totally marginal influence upon the tolerable levels of the electrostatic discharge voltage, i.e. attributing to the protection diode the function of diverting to ground under any circumstance an eventual negative electrostatic charge which could hit the particular pad of the integrated circuit. It has been a common belief that a mis-protection by a voltage limiting diode was caused by a delay in intervening (i.e. in switching-on) or by a failure of the diode itself. Such a common contention has been due to the fact that a good diode, when conducting under high injection conditions, shows a voltag drop smaller than 10 V.

The test system which is normally utilized in accordance with the standard specifications MIL-std 883, may be depicted by a current generator capable of supplying the necessary current within a few nanoseconds. The present inventors have found that, with an applied voltage of 3000 V, the current provided by such a test generator goes from 0 to about 2A in few nanoseconds. Under these conditions, a protection diode is far from operating in a zone of high injection but rather it reacts more by an ohmic type mechanism than by a normal "diffusion"-type mechanism. This kind of effect provokes an over-voltage with respect to the normal voltage values, which, in addition to depending upon the size and fabrication process of the protection diode, also depends upon the transition speed of the current peak delivered by the generator. Reasonably the consequent voltage peak across the diode alone may be estimated to be about 40 V in accordance with the tests conducted, and being that the breakdown voltage of the gate oxide is often about 60 V, the role of an eventual resistance connected between the diode and the real common potential node of the circuit becomes fundamental according to this new interpretative model of the phenomenon.

It has now been found, in fact, that such a resistance due to the resistance of the metal track to which the protection diode is connected may reduce the maximum tolerable voltage from an expected value of over 10,000 V to just 2000–3000 V.

Through a preliminary series of experiments conducted on statistically significant quantities of integrated circuits whose input pads were purposely placed at progressively greater distances from a ground pad along the path of a ground metal track ($V_{SS}$), and to which metal track the cathode of as many protection diodes of as many distinct input pads was connected, it has been possible to demonstrate that the maximum tolerable electrostatic discharge voltage of the various input pads decreases with increasing length of the resistive path, represented by the increasing length of the ground metal track between the cathode terminal of each diode and the ground pad of the circuit and that the law of variation is substantially represented by a hyperbola. Such a law of variation also justifies the presumption of an essentially "ohmic" type behavior of the protection diode.

The experimental results obtained by testing a large number of devices of the same type according to the test procedure dictated by the standards: MIL-std 883, permitted the investors to obtain, through suitable mathematic operations, an empirical relationship substantially of the following type:

$$V_{DAM} = \frac{k}{R^x}$$

where:
  $V_{DAM}$ is the electrostatic discharge voltage at which failure was observed;
  R is the resistance (expressed in ohms) of the particular metal track between the connection point to the cathode of the protection diode and the relative ground pad of the integrated circuit (i.e. the real node at a common potential);
  x is a mathematically derived exponent which is close to 1;
  k is a constant which is dependent upon the characteristics of the test apparatus as well as being dependent upon the intrinsic characteristics of the integrated circuit being tested.

Such a relationship was satisfied both in the case of a first lot of samples tested repeatedly at progressively increasing discharge voltages, starting from 1000 V and increasing the voltage by 200 V each time until failure, and in the case of a second lot of "virgin" samples tested directly at a failure voltage.

For both lots of samples, the x exponent was substantially unchanged and equal to 1.06–1.07, confirming a substantially hyperbolic relationship between the breakdown discharge voltage ($V_{DAM}$) and the resistance (R) of the pertinent length of metal track between the protection diode terminal and the ground pad (i.e. real common potential node). The tests have confirmed, even if in a qualitative manner, the unsuspected exceptional influence of such a resistance upon the maximum tolerable electrostatic discharge voltage of a particular input pad of the integrated circuit.

The k factor, which depends essentially upon the characteristics of the test apparatus dictated by said standards as well as being dependent upon the intrinsic characteristics of the integrated circuit being tested, had a value of about 30,000 in the case of the first lot, while in the case of the second lot of virgin samples it had a value of about 38,000.

For a given test apparatus, the value of such k constant will depend essentially upon the characteristics of the particular integrated semiconductor structure connected to the pad which is more sensitive to failure by electrostatic discharge. For example, in bipolar integrated circuits, the base-emitter junction appears to be the most sensitive structure and the failure mechanism appears to be due typically to the melting of silicon determined by localized overheating in the depletion region of the junction. In the case of MOS devices, the thin gate oxide layer is the structure more easily subject to failure by disruptive voltage breakdown. Therefore, the knowledge of the type and of the characteristics of such structures will allow the designer to establish with a sufficient approximation the value of the k constant appearing in the above noted hyperbolic type relationship, on the basis of acquired experiences.

Therefore, in accordance with the method of the present invention, the resistance between a terminal of a protection diode, which is connected by means of its other terminal to the relative input pad of the integrated circuit to be protected against electrical discharges of electrostatic origin, and a common potential node of the integrated circuit (ground or supply node) must be less or equal to a value R given by the empirical relationship:

$$R = \frac{k}{V_{DAM}}$$

where:

$V_{DAM}$ is the minimum level of discharge voltage capable of causing damages which must be ensured; and k is a pre-determined constant which may be experimentally determined.

The present invention may be realized in practice by minimizing the resistance of the electrical connection between a terminal of a protection diode and the respective common potential node of the integrated circuit to which the terminal is connected. This is realized by intentionally increasing the conductivity of such an electrical connection, for example by increasing the surface of the metallization layer wherever there are useable areas along the path toward the relative pad and/or, as it is frequently the case in integrated circuits, by utilizing to this end different available levels of metallization by connecting them in parallel.

According to another embodiment of the invention, the protection diodes are physically made in the neighborhood of the respective ground ($V_{SS}$) or supply ($V_{DD}$) pad of the integrated circuit rather than, as it has been customary in the prior art, in proximity of the relative input pad to be protected. One terminal of the protection diode will be electrically connected with a minimum (truly insignificant) resistance to the particular common potential node of the circuit, while the other terminal of the protection diode may be electrically connected in any suitable way to the input node (pad) to be protected of the integrated circuit.

The resistance of such an electrical connection between the input pad to be protected and the terminal of the protection diode is substantially unimportant with respect to the capacity of the integrated circuit to withstand discharges of electrostatic nature.

In compliance with the teachings of the present invention, it may be advantageous to provide so-called "ring" metallizations both for the supply common potential node ($V_{DD}$) and for the ground ($V_{SS}$) common potential node using different (superimposed) levels of metallization. These so-called "ring" metallizations are in practice relatively wide metal tracks extending substantially along the entire perimeter of the chip. In this way, and eventually by means of appropriate cross-over connections between various levels metallization, it is possible to ensure that both nodes of the integrated circuits "really" at a common potential be advantageously close to all of the input pads, and eventually also to all the output pads of the integrated circuits so that the electrical connections to the respective terminals of the protection diodes may be realized with a minimum resistance.

FIG. 1 illustrates a view of a substrate showing an integrated circuit and a protection diode mounted thereon. An input pad and a ground pad, as well as the connections between the two pads and the connection diode and the IC are illustrated for a single level of metallization.

Figure 2:
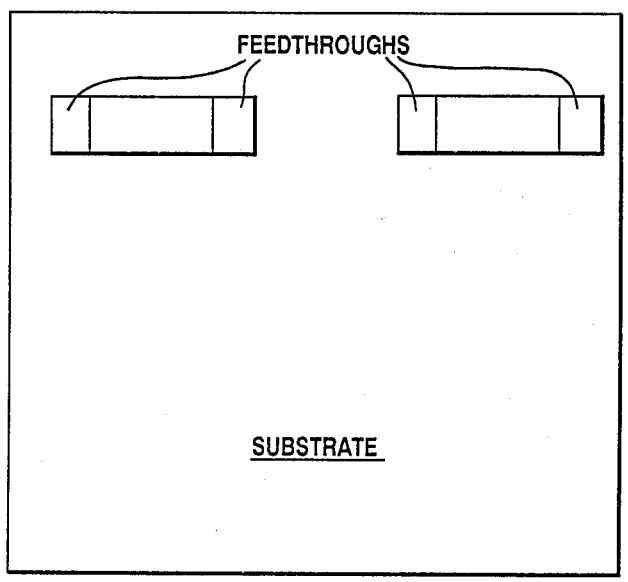
FIG. 2 illustrates a second level of metallization which may be present on the substrate of FIG. 1.

FIG. 2 illustrates the same substrate of FIG. 1 showing an additional level of metallization.

On this additional level of metallization, additional connections between the input and ground pads and the protection diode are provided in parallel with the connections therebetween on the first level of metallization so as to reduce the resistance between the protection diode and the input and ground pads.

Figure 3:
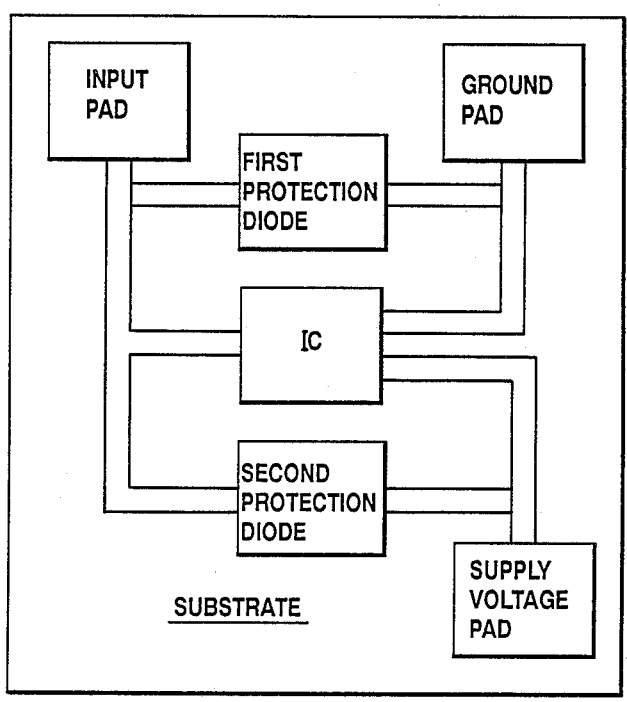
FIG. 3 illustrates a substrate containing an integrated circuit and two protection diodes.

FIG. 3 illustrates a substrate similar to that of FIG. 1 with the addition of a second protection diode which is connected between the input pad and a supply voltage pad to additionally protect the IC.

Figure 4:
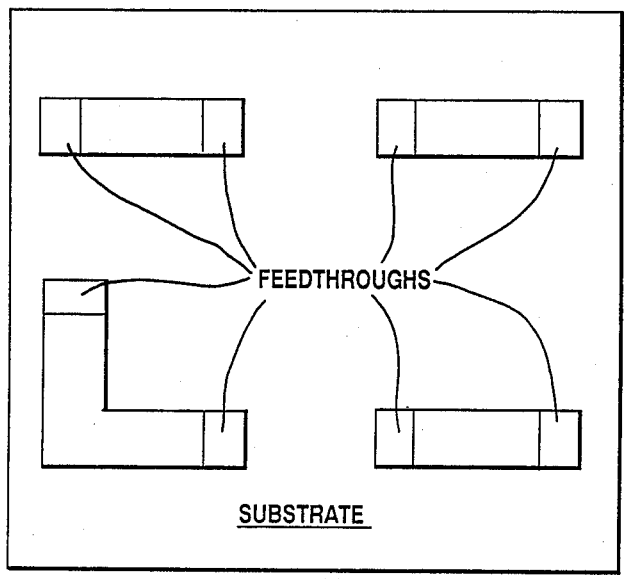
FIG. 4 illustrates a second level of metallization which may be present on the substrate of FIG. 3.

In a fashion similar to FIG. 2, FIG. 4 illustrates a second level of metallization for the substrate of FIG. 3 in which additional parallel connections are provided to reduce the resistance between the input and ground pads and the first protection diode and to reduce the resistance between the connections between the input pad and the voltage supply pad and the second protection diode.

Throughout the foregoing specification and in the annexed claims, by the words "metallization", "level of metallization" and "metallization or metal layer" it is intended to identify a layer-type structure of a metal, commonly obtained by first depositing a layer of a suitable thickness of metal which is then cut back by a photo-etch-resist process, forming part of the integrated circuit and destined to provide electrically conductive paths for connecting the various active and passive components of the integrated circuit among themselves as well as to the relative pads (pins) of the integrated circuit and made with any suitable material. Therefore by such words it is intended to include also conductive materials which, under certain aspects, may not be regarded as metals or as metallic alloys in the most restrictive meaning of such words and which may instead be regarded as highly conductive semiconductors, composite materials, intermetallic materials, conductive resins, etc.

What we claim is:

1. In a method of protecting semiconductor devices forming part of a monolithically integrated circuit from discharges of electrostatic nature comprising connecting a protection diode between a pad of the integrated circuit and a common potential node of the integrated circuit, the improvement represented by making the electrical connection between said protection diode and said common potential node of the integrated circuit so that the resistance of such a connection is lower than a value R given by the expression:

$$R = \frac{k}{V_{DAM}}$$

where:
  $V_{DAM}$ is the minimum value of the voltage of an electrostatic discharge which must be withstood by integrated semiconductor structures connected to said pad of the integrated circuit without damage and
  k is an experimentally pre-determined constant.

2. The method according to claim 1, wherein said resistance R is lower than 10 ohms.

3. The method according to claim 1, wherein said electrical connection between a terminal of said diode and said common potential node of the integrated circuit is made utilizing at least two levels of metallization connected electrically in parallel.

4. The method according to claim 1, wherein said integrated circuit comprises a plurality of input pads, each input pad being provided with at least a limiting diode toward a first common potential node and a second limiting diode toward a second common potential node, and wherein the connection of a terminal of said limiting diodes to the respective common potential node of the integrated circuit is made utilizing two distinct metallizations disposed on different levels for reducing the resistance of said connections.

5. An integrated circuit comprising a voltage limiting diode connected between a pad of the integrated circuit and a common potential node of the integrated circuit for protecting from discharges of electrostatic nature an integrated semiconductor structure connected to said pad,
  wherein the electrical connection between said diode and said common potential node of the integrated circuit has a resistance lower than a value R given by the expression $$R = \frac{k}{V_{DAM}}$$

where:
  $V_{DAM}$ is a minimum value of an electrostatic discharge voltage which must be withstood by said integrated structure without damage and
  k is an experimentally pre-determined constant.

6. The integrated circuit according to claim 5, wherein said resistance R is lower than 10 ohms.

7. The integrated circuit according to claim 5, wherein said electrical connection between a terminal of said diode and said common potential node of the integrated circuit is made using at least two levels of metallization connected in parallel.

8. The integrated circuit according to claim 5, wherein the integrated circuit comprises a plurality of input pads, each input pad being provided with a limiting diode toward a first common potential node and with a second limiting diode toward a second common potential node of the integrated circuit, the connection of a terminal of said protection diodes to the respective common potential node of the integrated circuit being made utilizing two distinct metallizations disposed on distinct levels for reducing the resistances of said connections.

* * * * *